(12) United States Patent
Matsuzaki et al.

(10) Patent No.: US 6,519,171 B2
(45) Date of Patent: Feb. 11, 2003

(54) SEMICONDUCTOR DEVICE AND MULTICHIP MODULE (75) Inventors: Yasurou Matsuzaki, Kawasaki (JP); Masao Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/904,478

(22) Filed: Jul. 16, 2001

(65) Prior Publication Data
US 2002/0060933 A1 May 23, 2002

(30) Foreign Application Priority Data
Nov. 17, 2000 (JP) ........................................ 2000-351602

(51) Int. Cl.[7] ................................................ G11C 5/02
(52) U.S. Cl. ............................. 365/51; 365/63; 365/201
(58) Field of Search ........................... 365/201, 51, 63, 365/230.06, 230.08, 52

(56) References Cited
U.S. PATENT DOCUMENTS
6,134,631 A * 10/2000 Jennings, III ................ 711/117
6,304,973 B1 * 10/2001 Williams ..................... 713/201

* cited by examiner

Primary Examiner—David Nelms
Assistant Examiner—Gene N. Auduong
(74) Attorney, Agent, or Firm—Arent Fox Kintner Plotkin and Kahn (57) ABSTRACT A semiconductor memory device manufactured separately is connected to an interface unit of a semiconductor device. An internal memory formed in the semiconductor device is connected to at least a part of the interface unit. A memory selecting circuit makes the internal memory accessible in a first operation mode, and makes the internal memory inaccessible in a second operation mode. Therefore, for example, putting the semiconductor device into the first operation mode and accessing the internal memory enables the semiconductor device to operate as a predetermined system even when the semiconductor memory device is not connected to the interface unit. The substitution of the internal memory for the semiconductor memory device makes it possible for the semiconductor device to test the interface unit and associated circuits thereof by itself. This consequently allows improvement in the assembly yield of multichip modules.

17 Claims, 9 Drawing Sheets

SEMICONDUCTOR DEVICE AND MULTICHIP MODULE

BACKGROUND OF THE INVENTION

1. Field of the Invention

The present invention relates to an MCM (multichip module) into which a plurality of semiconductor devices are merged, and to semiconductor devices to be used in the MCM.

2. Description of the Related Art

As electronic apparatuses grow more miniaturized and sophisticated, miniaturization and sophistication are also demanded of semiconductor devices to be mounted on the electronic apparatuses. On this account, system LSIs capable of constituting a system on a single chip and MCMs, or LSI packages on which a plurality of bare chips are mounted, have been developed. Recently, there have been developed MCMs called chip-on-chip, or LSI chips having other LSI chips layered thereon.

For example, in the cases of merging logic chips and memory chips to manufacture MCMs, the logic chips and the memory chips are individually completed through different wafer processes. The completed logic chips and memory chips are individually subjected to probe tests for good-die screening before the dicing of the chips on the wafers. Then, only the good dies are used to assemble MCMs.

In general, logic chips to be mounted on MCMs have a control circuit for controlling a memory chip, and an interface circuit to the memory chip. No memory chip is connected, however, at the occasion of the probe tests on the logic chips. Accordingly, there has been a problem that the probe tests cannot involve operation tests on the above-mentioned control circuit and interface circuit.

For example, in the cases where data to be processed in functional blocks on a logic chip is temporarily stored in a memory chip (or when the memory chip is used as a buffer), it is impossible to evaluate the passing of data between the functional blocks and the memory chip, and between the functional blocks.

Conventionally, the operation tests and evaluations mentioned above could not be made until logic chips and memory chips were assembled into MCMs. Therefore, in case where a control circuit or an interface circuit was defective in an assembled MCM, the assembled MCM had to be discarded as a defective even though it contained a good memory chip.

SUMMARY OF THE INVENTION

It is an object of the invention to surely perform tests independently on a semiconductor device to be used for MCMs before the MCM assembly.

It is another object of the invention to improve the assembly yield of the MCM.

According to one of the aspects of the semiconductor device and multichip module in the present invention, a semiconductor memory device manufactured separately is connected to an interface unit of the semiconductor device. An internal memory formed in the semiconductor device is connected to at least a part of the interface unit. A memory selecting circuit makes the internal memory accessible in a first operation mode, and makes the internal memory inaccessible in a second operation mode. Therefore, for example, putting the semiconductor device into the first operation mode and accessing the internal memory allows the semiconductor device to be operated as a predetermined system even when the semiconductor memory device is not connected to the interface unit. The substitution of the internal memory for the semiconductor memory device makes it possible for the semiconductor device to test the interface unit and associated circuits thereof alone, by itself. This consequently allows improvement in the assembly yield of the multichip module. When the internal memory is used for the tests, the internal memory may have a memory capacity smaller than that of the semiconductor memory device.

After the semiconductor device and the semiconductor memory device are connected via the interface unit (assembled into a multichip module), the semiconductor device can make access to the internal memory in the first operation mode and make access to the semiconductor memory device in the second operation mode to increase the memory capacity available. For example, forming a terminal for transmitting the information that indicates the first operation mode or the second operation mode to the semiconductor memory device facilitates the switching of accesses between the internal memory and the semiconductor memory device.

According to another aspect of the semiconductor device and multichip module in the present invention, at least a part of the interface unit is shared between the internal memory and the semiconductor memory device. On this account, the semiconductor device can make access to the internal memory and the semiconductor memory device with the interface unit minimized in circuit scale. Accessing the semiconductor memory device in the second operation mode will not cause any conflicts in the data bus or the like.

According to another aspect of the semiconductor device and multichip module in the present invention, the interface unit includes a first interface unit and a second interface unit. The first interface unit is connected to the internal memory, and outputs a control signal when in the first operation mode. Here, the semiconductor device can make access to the internal memory. The second interface unit is connected to the semiconductor memory device, and outputs a control signal when in the second operation mode. Here, the semiconductor device can make access to the semiconductor memory device. The semiconductor device controlling the first and second interface units in accordance with its operation mode facilitates the access to the internal memory and the semiconductor memory device.

According to another aspect of the semiconductor device in the present invention, the first interface unit outputs to the internal memory a first selecting signal which is activated upon access to the internal memory. The second interface circuit outputs to the semiconductor memory device a second selecting signal which is activated upon access to the semiconductor memory device. The memory selecting circuit activates the first interface unit in the first operation mode to operate the internal memory, and activates the second interface unit in the second operation mode to operate the semiconductor memory device. Thus, the semiconductor device activating the first and second interface units in accordance with its operation mode facilitates the access to the internal memory and the semiconductor memory device.

According to another aspect of the semiconductor device and multichip module in the present invention, the semiconductor device enters the first operation mode (test mode) in performing tests, and enters the second operation mode (normal operation mode) in operating the semiconductor memory device. Executing operation tests by using the internal memory facilitates the determination as to whether a defect originates in the semiconductor device or the semiconductor memory device. Moreover, the substitution of the internal memory for the semiconductor memory device makes it possible for the semiconductor device to test the interface unit and associated circuits thereof by itself before the semiconductor memory device is connected to the interface unit.

According to another aspect of the semiconductor device in the present invention, memory elements of the internal memory are different in type from those of the semiconductor memory device. A conversion circuit of the internal memory converts the timing of outputting a control signal of the semiconductor memory device from the interface unit into timing for operating the internal memory. By virtue of the conversion circuit, the internal memory operates as if it is the semiconductor memory device. That is, the internal memory imitatively makes the same operation as that of the semiconductor memory device. Forming the internal memory with memory cells of a simpler manufacturing process allows a reduction in the chip size of the semiconductor device. For example, when the semiconductor memory device is constituted as a DRAM, the internal memory may be formed as an SRAM.

According to another aspect of the semiconductor device in the present invention, the interface unit can judge whether or not a refresh controlling signal is transmitted properly, even when the internal memory is composed of static memory elements. That is, operation tests of the control circuit for generating the refresh controlling signal and the interface unit on the semiconductor device can be performed by the semiconductor device alone.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 1:
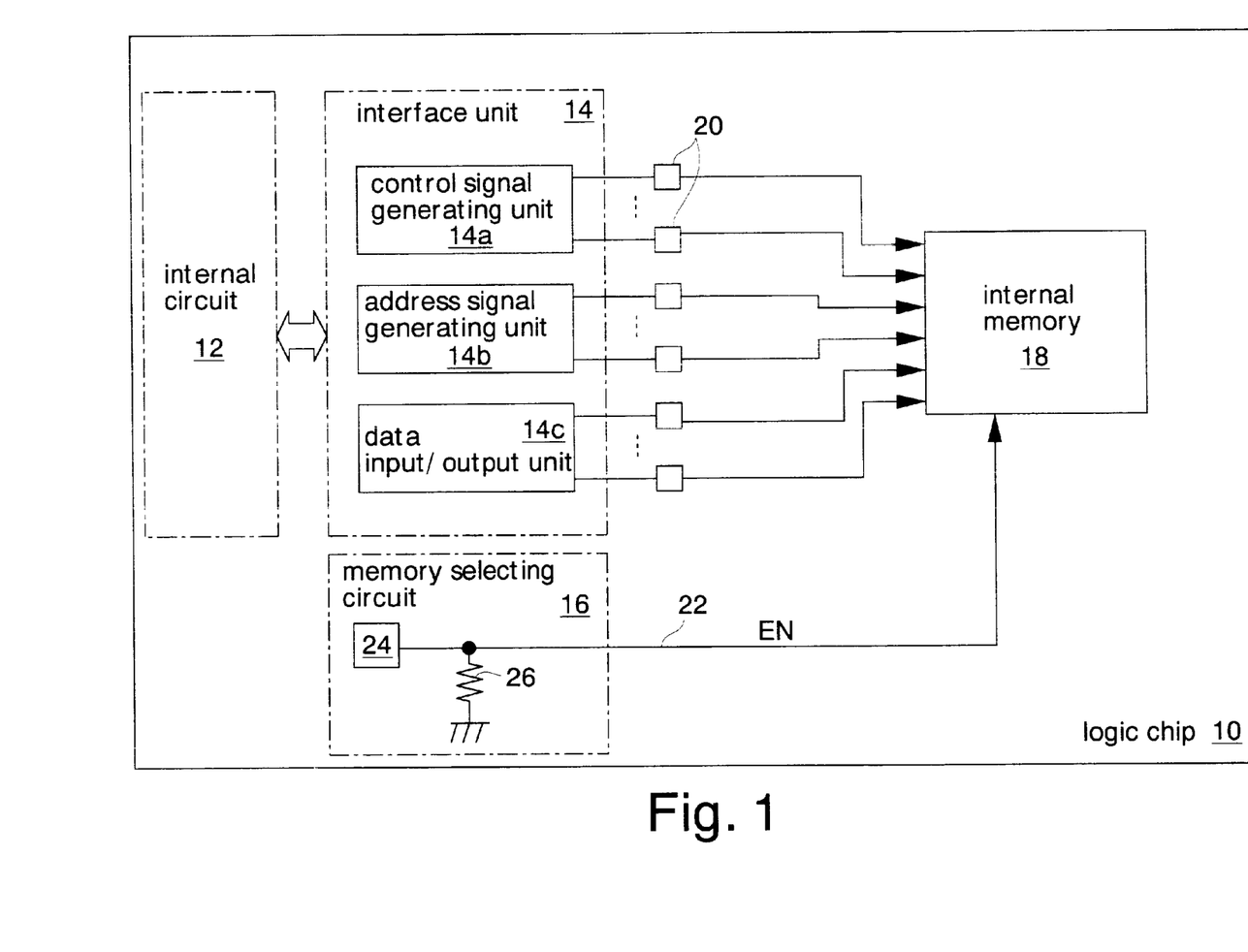
FIG. 1 is a block diagram showing a logic chip of a first embodiment.
Figure 2:
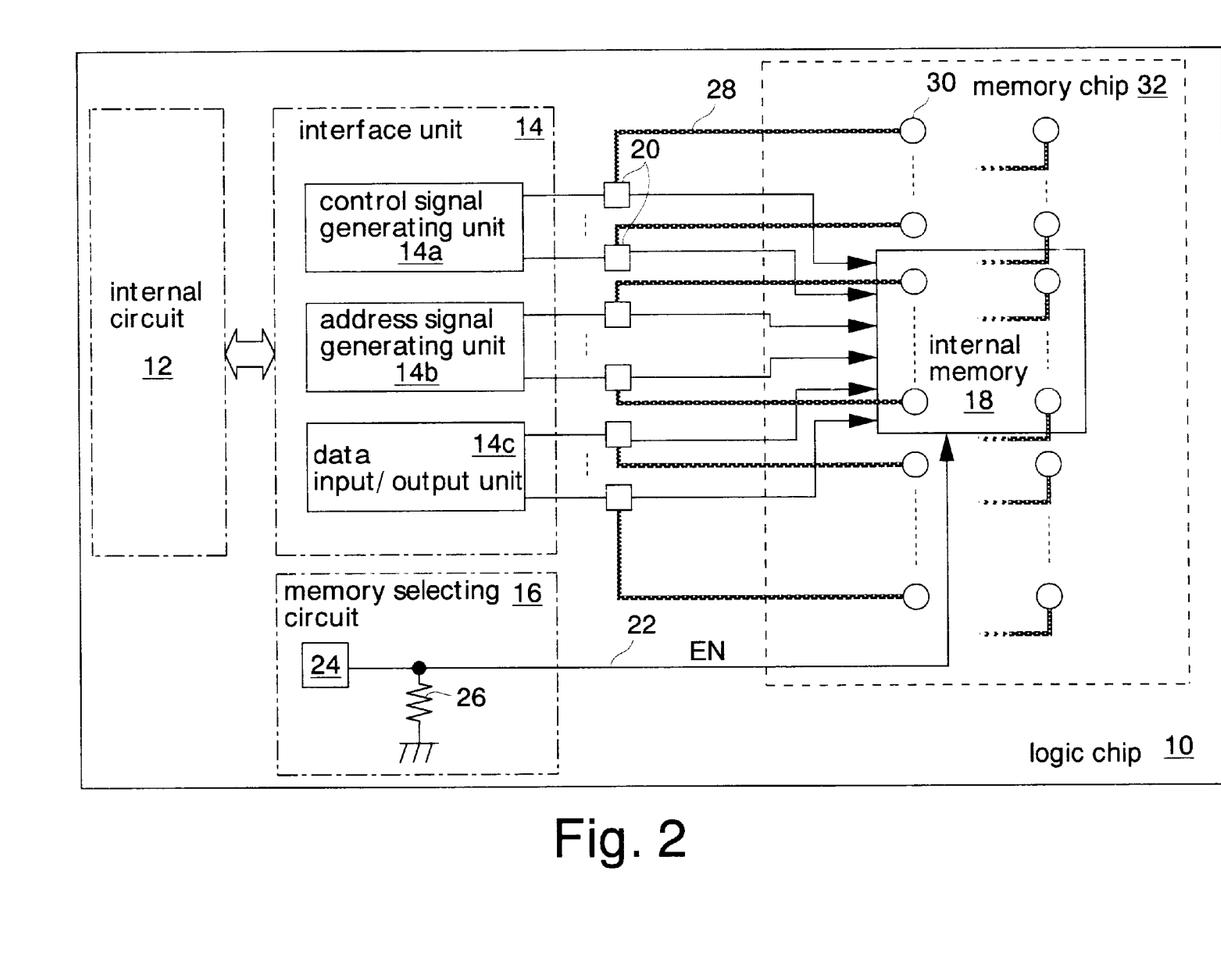
FIG. 2 is a block diagram showing a multichip module of the first embodiment.

FIGS. 1 and 2 show a first embodiment of the semiconductor device and multichip module in the present invention.

FIG. 1 shows a logic chip 10, or a semiconductor device to be used in an MCM. The logic chip 10 shown in the diagram has gone through its wafer process, and is capable of operating alone, by itself. In reality, a plurality of logic chips 10 is coupled on a wafer.

The logic chip 10 has an internal circuit 12, an interface unit 14, a memory selecting circuit 16, and an internal memory 18 (SRAM, for example).

The interface unit 14 is connected to the internal circuit 12, and has a control signal generating unit 14a, an address signal generating unit 14b, and a data input/output unit 14c. The control signal generating unit 14a outputs control signals for controlling the internal memory 18 and a memory chip 32 (FIG. 2) to be described later. The address signal generating unit 14b outputs address signals for designating a memory cell in operating the internal memory 18 and the memory chip 32. The data input/output unit 14c inputs and outputs data to/from the internal memory 18 and the memory chip 32.

Contacts 20 for interconnected wiring are formed on the signal lines that establish connections between the interface unit 14 and the internal memory 18. The interconnected wiring will be described in conjunction with FIG. 2 to be discussed later.

The memory selecting circuit 16 has a testing pad 24 which is connected to the internal memory 18 through a signal line 22, and a high resistance 26 which is interposed between the signal line 22 and a ground line. The logic level of the signal line 22 is transmitted as an enable signal EN to the internal memory 18. That is, the enable signal EN turns to high level under the application of a high voltage to the pad 24, and turns to low level when the pad 24 is open. The internal memory 18 receives the enable signal EN of high level to enter an enable state (first operation mode). The internal memory 18 receives the enable signal EN of low level to be inactivated (second operation mode).

FIG. 2 shows a state where the interconnected wiring 28 and bumps 30 are formed on the logic chip 10 shown in FIG. 1.

The interconnected wiring 28 establishes connections between the contacts 20 and the bumps 30. In a subsequent manufacturing process, a semiconductor memory device, or the memory chip 32 (SRAM, for example), is connected to the logic chip 10 via the bumps 30 to form a multichip module of chip-on-chip structure. The internal memory 18 is provided with a memory capacity smaller than that of the memory chip 32. As shown in FIG. 2, in this embodiment, the signals input/output through the interface unit 14 are shared between the internal memory 18 and the memory chip 32.

Figure 3:
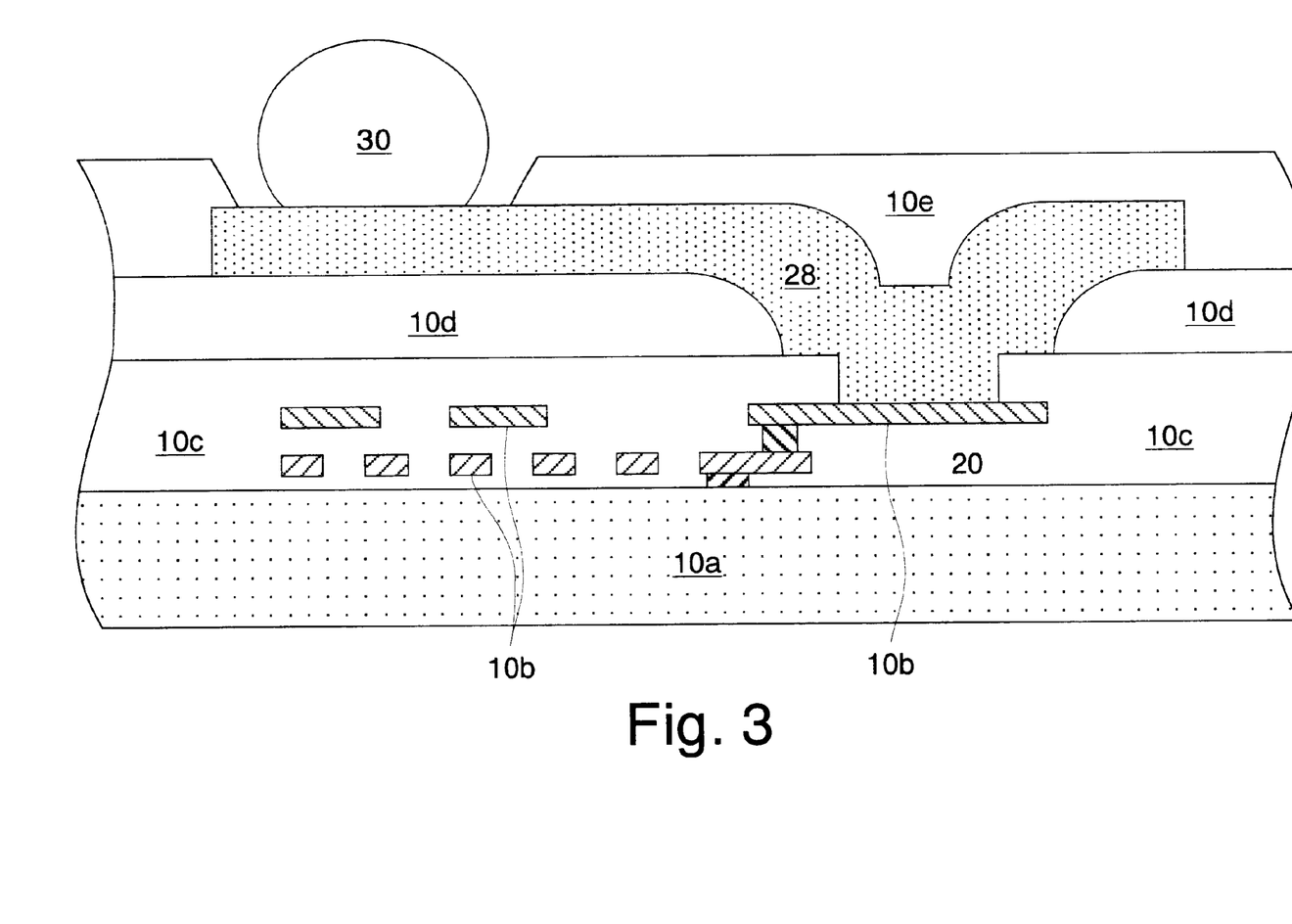
FIG. 3 is a sectional view showing the essential parts of FIG. 2.

FIG. 3 shows a section of the logic chip 10 shown in FIG. 2.

The logic chip 10 is formed by using, e.g., a silicon substrate 10a. Transistors which are not shown in the diagram are formed on the silicon substrate 10a. The wiring 10b for interconnecting the transistors to constitute a circuit is formed on the silicon substrate 10a. The pieces of wiring 10b are isolated from each other by an insulator 10c. An insulator 10d made of polyimide or the like is formed on the insulator 10c. The insulators 10c and 10d have openings, in which the contact 20 for the wiring 10b are formed. On the contact 20 is formed the interconnected wiring 28 which is composed of aluminum, copper, or the like. The interconnected wiring 28 is covered with a cover film 10e of resin. The cover film 10e has openings for exposing the interconnected wiring 28. The bumps 30 composed of solder, gold, or the like are formed in the openings. In some cases, the bumps 30 are also formed on the memory chip 32.

Next, description will be given of a probe test on the logic chip 10. The probe test is performed before dicing, when chips are still in the state of a wafer.

Initially, test patterns are supplied to the logic chip 10, and the data output from the logic chip 10 and an expectation value are compared and a functional test on the internal circuit 12 is performed. Here, neither the control circuits for controlling the memory chip 32 nor the functional blocks for inputting/outputting data to/from the memory chip 32 undergo the test.

After predetermined circuits in the internal circuit 12 are confirmed to operate normally, high voltage is applied to the pad 24 of the memory selecting circuit 16. This enables the internal memory 18 to operate. Then, with the internal memory 18 substituted for the memory chip 32, tests are performed on the above-mentioned control circuits, functional blocks, and interface unit 14. In other words, the circuit operations that were conventionally unable to check through probe tests on the logic chip 10 can be tested. This probe test, in contrast to conventional tests, allows sure screening for good dies of logic chips 10. The internal memory 18 may have the minimum memory capacity necessary for testing the control circuits and functional blocks.

The memory chip 32 is performed a probe test independent from a logic chip. Then, after the probe test, a good die of logic chip 10 and a good die of memory chip 32 are connected via the bumps 30 to assemble an MCM. After the probe tests, the pad 24 is kept open so that the enable signal EN is constantly at a low level. That is, after the MCM assembly, the internal memory 18 will never be activated. Since the pad 24 is kept open after the probe test, the pad 24 may be formed in the minimum size that allows probe contact.

As has been described, in the present embodiment, the internal memory 18 which substitutes for the memory chip 32 is formed on the logic chip 10. The logic chip 10 enters the first operation mode (test mode) to perform tests, and enters the second operation mode (normal operation mode) to operate the semiconductor memory device. Therefore, the internal circuit 12 and the interface unit 14 can be tested before the memory chip 32 is connected to the logic chip 10 (i.e., by the logic chip 10 alone). As a result, good dies of logic chips 10 and good dies of memory chips 32 can be used to assemble MCMs, thereby improving the assembly yield of the MCMs.

The memory capacity of the internal memory 18 is made smaller than that of the memory chip 32, being lowered to the minimum capacity that allows tests on the internal circuit 12 and the interface unit 14. This prevents the logic chip 10 from greatly increasing in chip size.

Figure 4:
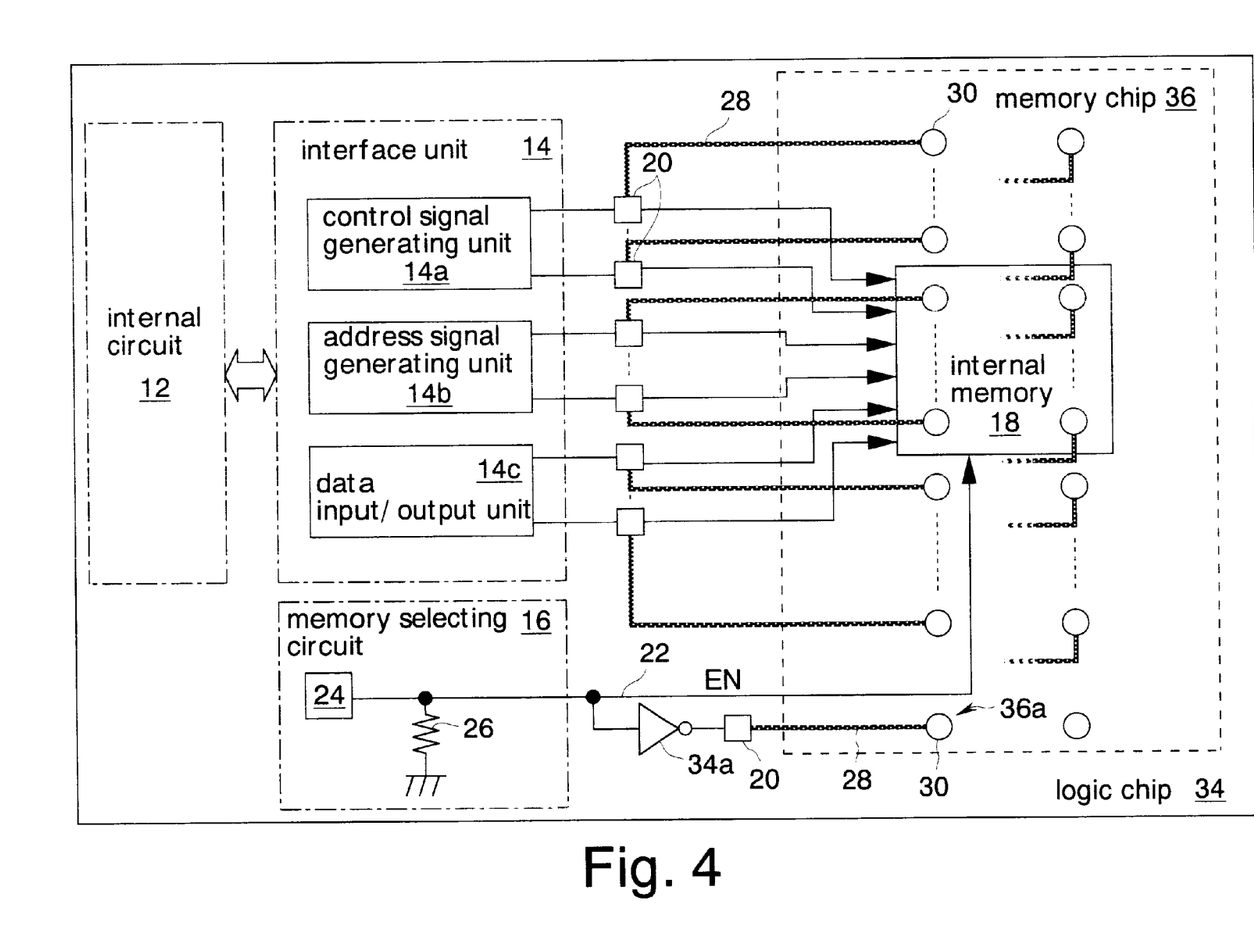
FIG. 4 is a block diagram showing a multichip module of a second embodiment.

FIG. 4 shows a second embodiment of the semiconductor device and multichip module in the present invention. The same elements as those described in the first embodiment will be designated by identical reference numbers. Detailed description thereof will be omitted.

In this embodiment, a logic chip 34 includes an inverter 34a for inverting the logic of the enable signal EN. The inverted signal of the enable signal EN is connected to a bump 30 through a contact 20 and interconnected wiring 28. A memory chip 36 is provided with a dedicated terminal 36a for receiving the inverted signal of the enable signal EN through the bump 30. Other configurations of this embodiment are identical to that of the first embodiment.

In this embodiment, turning the enable signal EN to high level enables the internal memory 18, and turning the enable signal EN to low level enables the memory chip 36 to operate. Therefore, even after the logic chip 34 and the memory chip 36 are assembled into an MCM, the application of high voltage to the pad 24 can inactivate the memory chip 36 and activate the internal memory 18, thereby allowing tests on the internal circuit 12 and the interface unit 14. In assembling the MCM, the pad 24 is connected to a lead frame (external terminal) of the MCM with e.g. a bonding wire. Consequently, even if the MCM suffers a defect after shipment, for example, it is easy to determine whether the defect originates in the logic chip 34 or in the memory chip 36. Moreover, the logic chip 34 and the memory chip 36 need not be separated before the defective chip is analyzed in an LSI tester. Therefore, the defect analysis can be performed smoothly. Conventionally, it was difficult to separate the chips 34 and 36 so that they are tester-analyzable.

This embodiment can offer the same effects as those obtained from the first embodiment described above. Moreover, in this embodiment, the enable signal EN is switched to operate either the internal memory 18 or the memory chip 36. This facilitates the determination as to whether a defect has originated in the logic chip 34 or in the memory chip 36.

The internal memory 18 can be operated after the connection of the logic chip 34 and the memory chip 36 through the interface unit 14 (after the assembly into a multichip module). Therefore, the internal memory 18 can be used as a work memory or a buffer memory to increase the memory capacity available to the MCM.

Constructing the terminal 36a for transmitting of the first operation mode or the second operation mode to the memory chip 36 facilitates the switching of accesses to the internal memory 18 and the memory chip 36. Here, there occurs no conflict between data buses or the like.

Figure 5:
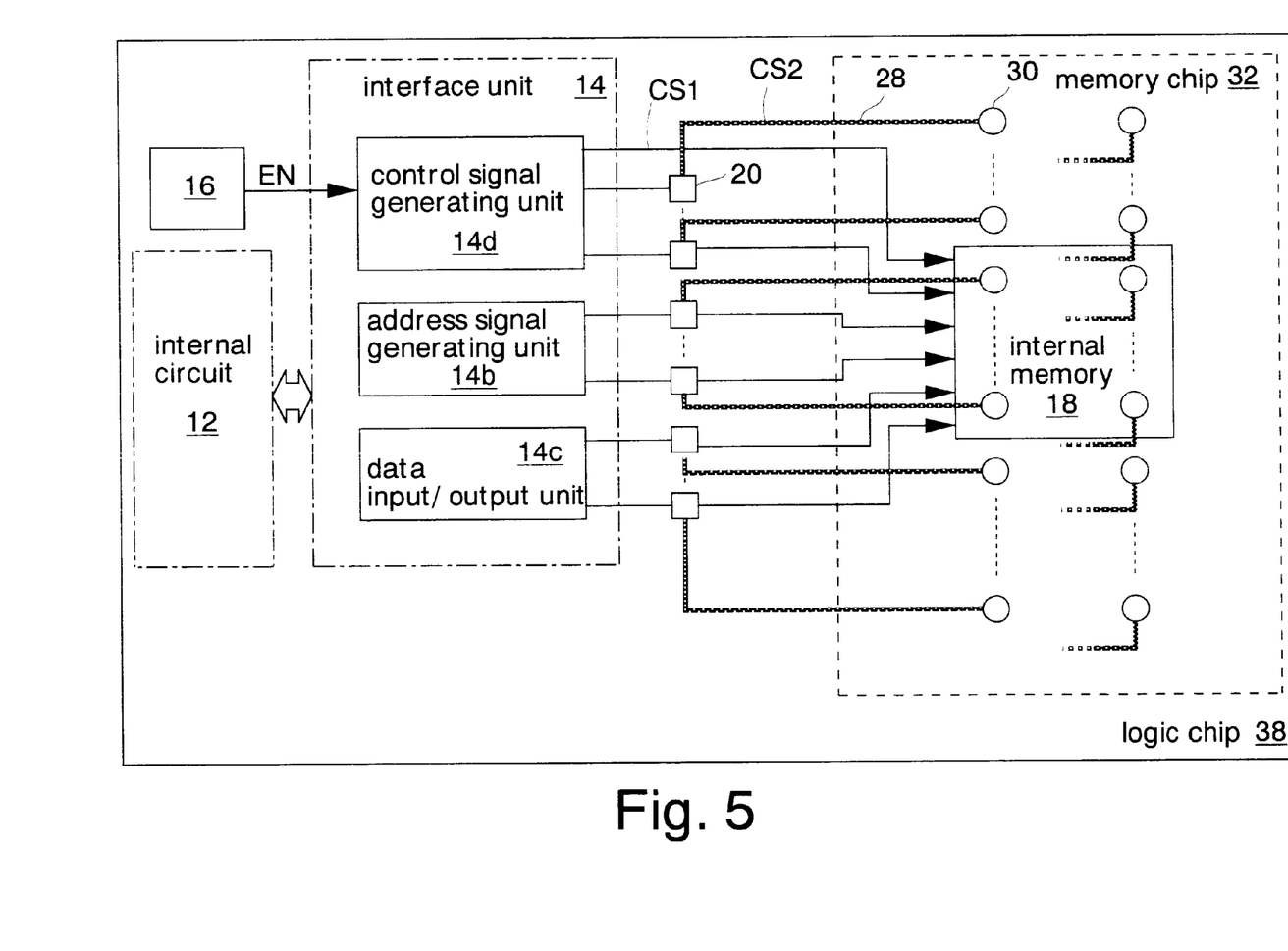
FIG. 5 is a block diagram showing a multichip module of a third embodiment.

FIG. 5 shows a third embodiment of the semiconductor device and multichip module in the present invention. The same elements as those described in the first embodiment will be designated by identical reference numbers. Detailed description thereof will be omitted.

In this embodiment, a control signal generating unit 14d of the interface unit 14 on a logic chip 38 differs from the control signal generating unit 14a of the first embodiment. The memory selecting circuit 16 outputs the enable signal EN to the control signal generating unit 14d. Other configurations of this embodiment are identical to that of the first embodiment.

The control signal generating unit 14d includes a first interface unit (not shown) for outputting a chip select signal CS1 to a chip select terminal of the internal memory 18, and a second interface unit (not shown) for outputting a chip select signal CS2 to a chip select terminal of the memory chip 32. The first interface unit activates the chip select signal CS1 when it receives the enable signal EN of high level from the memory selecting circuit 16 (first operation mode). The second interface unit activates the chip select signal CS2 when it receives the enable signal EN of low level from the memory selecting circuit 16 (second operation mode). In response to the activation of the chip select signal CS1, the internal memory 18 starts a read operation or a write operation. In response to the activation of the chip select signal CS2, the memory chip 32 starts a read operation or a write operation. The chip select signals CS1 and CS2 are signals conventionally formed on the internal memory 18 and the memory chip 32.

In this embodiment, the chip select signal CS1 is activated in testing the logic chip 10, and the chip select signal CS2 is activated in executing normal operations by using the memory chip 32. That is, the memory chip 32 does not require the terminal 36a dedicated to chip activation as the memory chip 36 of the second embodiment does.

This embodiment can offer the same effects as those obtained from the first and second embodiments described above. Besides, in this embodiment, the chip select signals CS1 and CS2, conventionally formed on the internal memory 18 and the memory chip 32, can be used to switch activations between the internal memory 18 and the memory chip 32. This facilitates accesses to the internal memory 18 and the memory chip 32. Since no special test terminal is required, it is possible to use the general-purpose memory chip 32. This consequently allows reduction in the manufacturing cost of the MCM.

Since the switching of access between the internal memory 18 and the memory chip 32 is effected by simply controlling the chip select signals CS1 and CS2, the interface unit 14 can be minimized in circuit scale.

Figure 6:
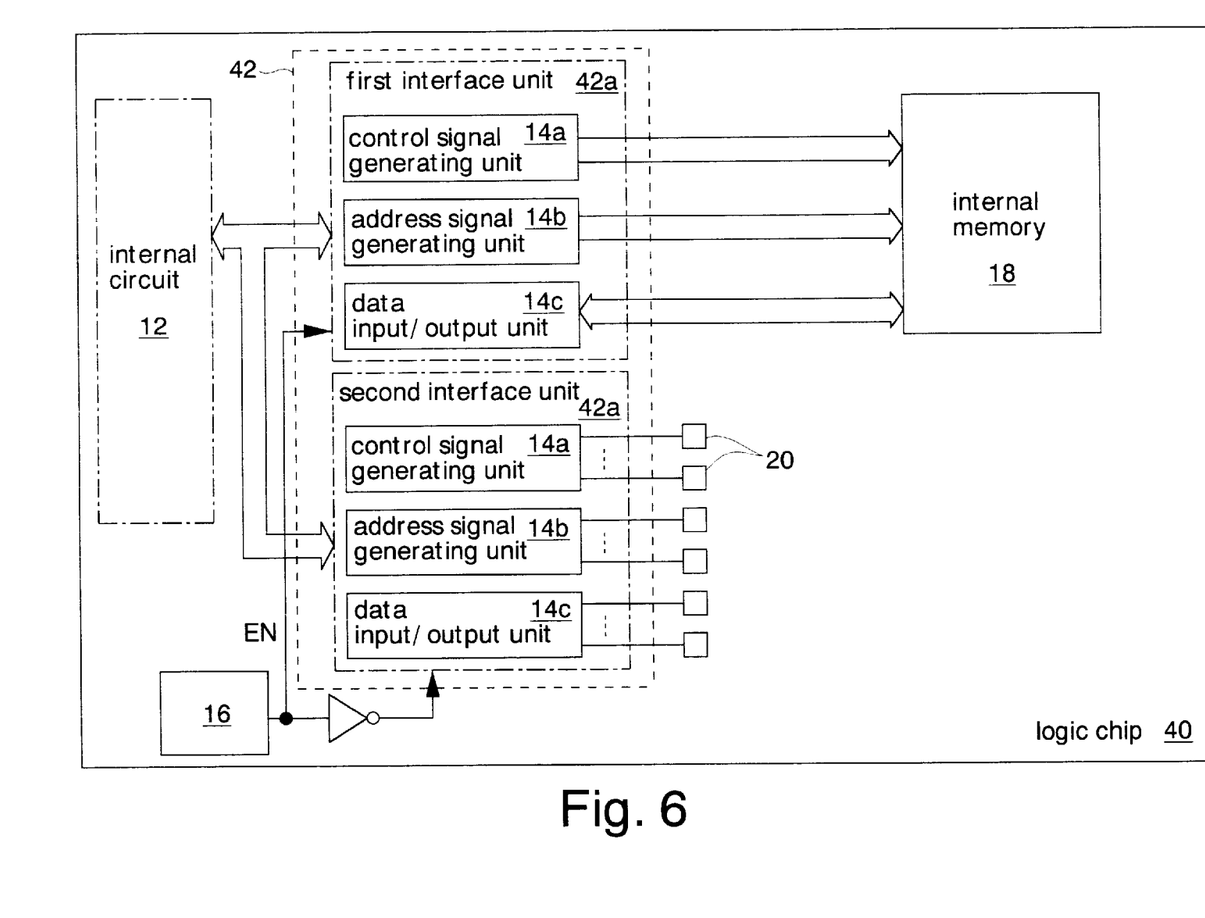
FIG. 6 is a block diagram showing a logic chip of a fourth embodiment.
Figure 7:
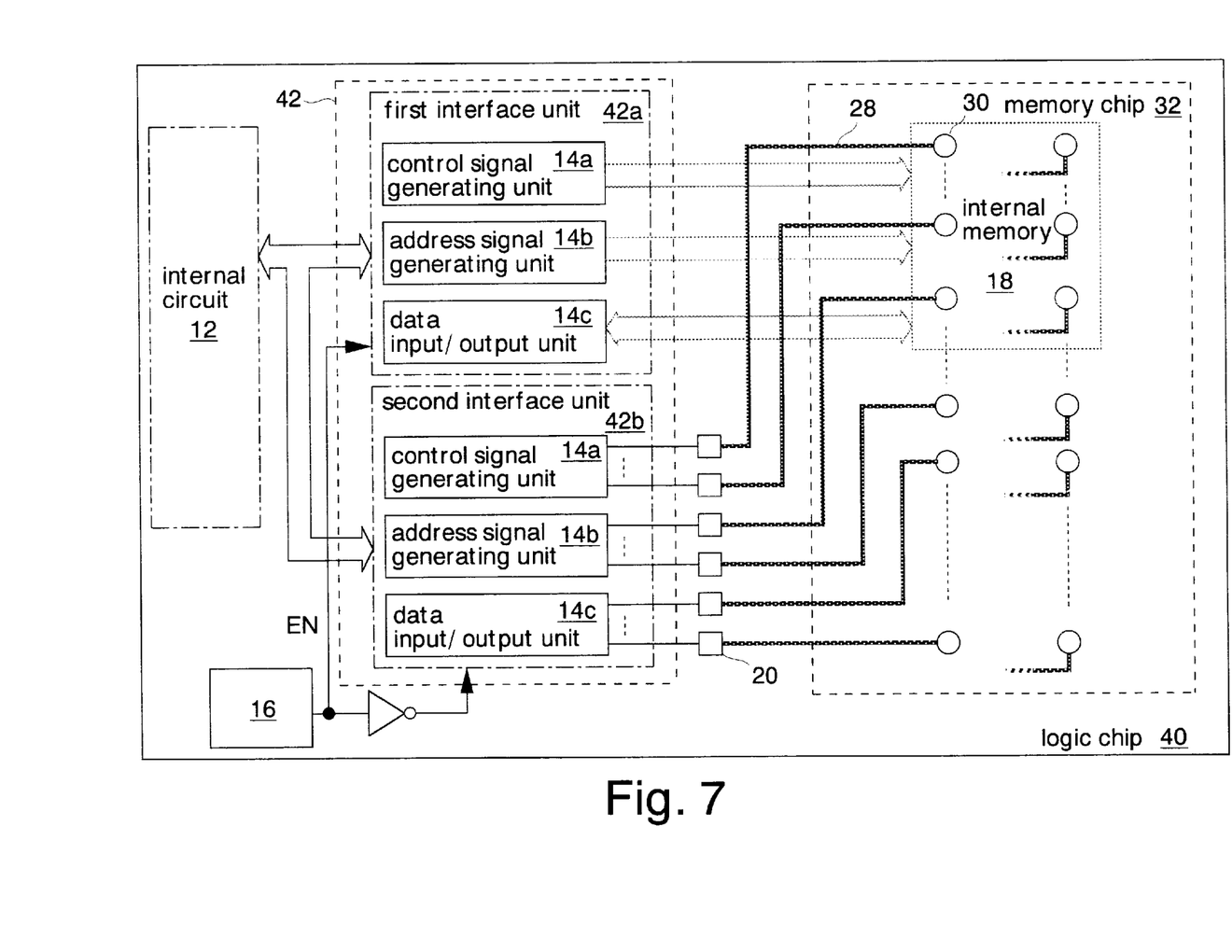
FIG. 7 is a block diagram showing a multichip module of the fourth embodiment.

FIGS. 6 and 7 show a fourth embodiment of the semiconductor device and multichip module in the present invention. The same elements as those described in the first embodiment will be designated by identical reference numbers. Detailed description thereof will be omitted.

In this embodiment, an interface unit 42 on a logic chip 40 includes a first interface unit 42a and a second interface unit 42b. The signal lines of the first interface unit 42a are connected to the internal memory 18. The signal lines of the first interface unit 42a are connected to contacts 20. The memory selecting circuit 16 outputs the enable signal EN to the first interface unit 42a, and outputs, through an inverter, the inverted signal of the enable signal EN to the second interface unit 42b.

FIG. 7 shows a state where the memory chip 32 is layered on the logic chip 40.

The first interface unit 42a is activated upon receiving the enable signal EN of high level, to input and output signals to/from the internal memory 18. The second interface unit 42b is activated upon receiving the enable signal EN of low level through the inverter, to input and output signals to/from the memory chip 32. The internal memory 18 and the memory chip 32 are each connected to separate signal lines.

This embodiment can offer the same effects as those obtained from the first and second embodiments described above. Moreover, in this embodiment, the internal memory 18 and the memory chip 32 are individually connected with separate signal lines through the first and second interface units 42a and 42b. Therefore, as compared with the foregoing embodiments, it is possible to reduce the parasitic capacitances of these signal lines. Besides, the first interface unit 42a is loaded with the terminal capacitances of the internal memory 18, and the second interface unit 42b is loaded with the terminal capacitances of the memory chip 32. This consequently allows high-speed operation of the internal memory 18 and the memory chip 32.

The absence of redundant wiring connected to the first and second interface units 42a and 42b allows reduction in noise.

Figure 8:
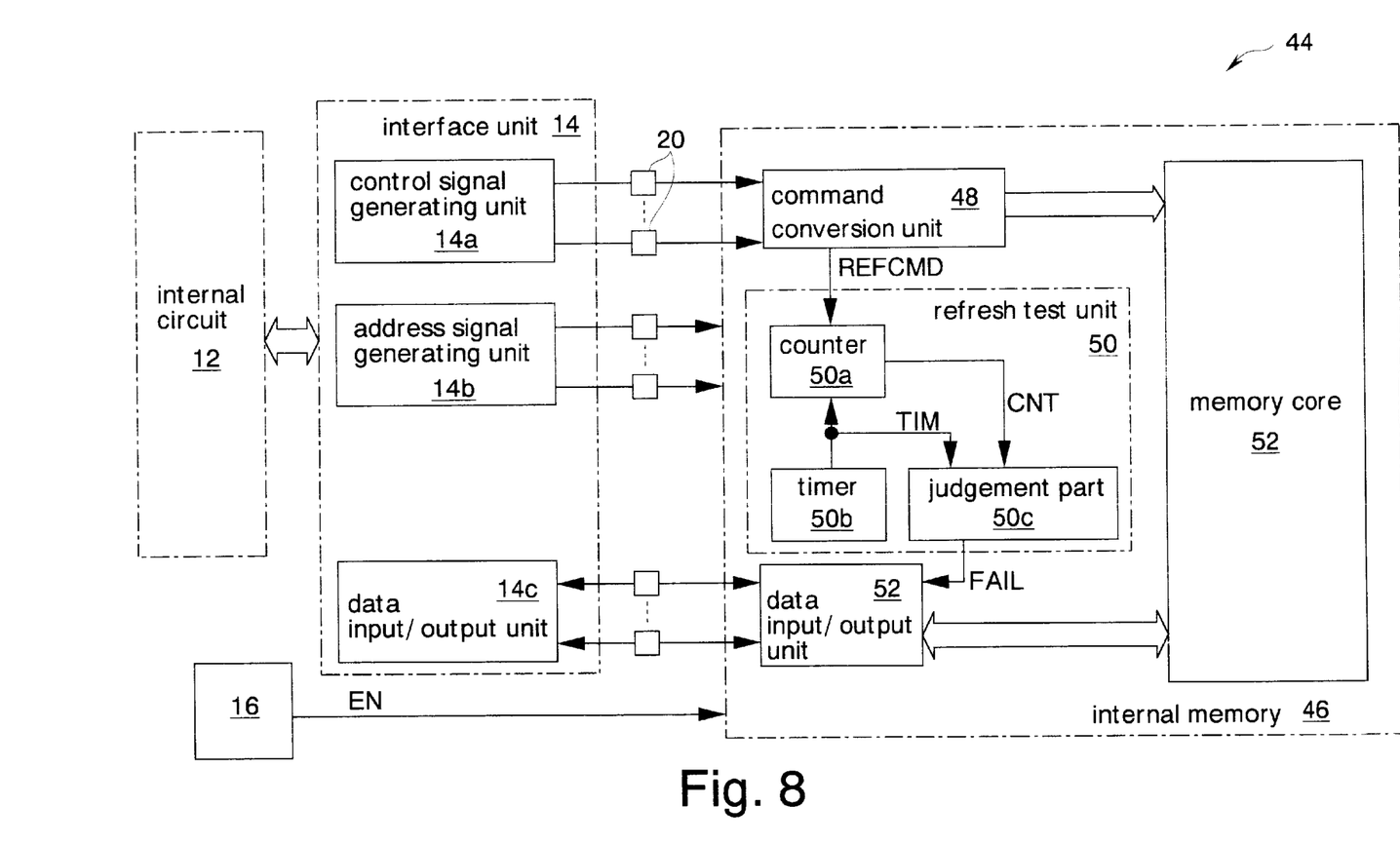
FIG. 8 is a block diagram showing a logic chip of a fifth embodiment.

FIG. 8 shows the essential parts of a fifth embodiment of the semiconductor device and multichip module in the present invention. The same elements as those described in the first embodiment will be designated by identical reference numbers. Detailed description thereof will be omitted.

In this embodiment, an internal memory 46 to be formed on a logic chip 44 differs from the internal memory 18 of the first embodiment. The memory chip (not shown) to be connected to the logic chip 44 via bumps has DRAM memory cells. Other configurations of this embodiment are identical to that of the first embodiment.

The internal memory 46 includes a command conversion unit 48, a refresh test unit 50, a data input/output unit 52, and an SRAM memory core 54.

The command conversion unit 48 converts command signals for DRAMs, output from the control signal generating unit 14a of the interface unit 14, into control signals for operating an SRAM. For example, when the command conversion unit 48 receives an RAS command for operating circuits corresponding to a row address of the DRAM and further receives a CAS command for operating circuits corresponding to a column address of the DRAM, it outputs control signals for operating the memory core 54. Moreover, after the reception of an RAS command, subsequent RAS commands are rejected until the reception of a precharging command. By virtue of the command conversion unit 48, the internal memory 46 operates as if it is a DRAM.

Memory cores of DRAMs use capacitors for their memory cells, and thus have a complicated manufacturing process. On the other hand, memory cores of SRAMs can be composed of flip-flops which are extensively used in logic LSIs. Accordingly, the formation of not a DRAM but an SRAM on the logic chip 44 prevents the manufacturing process of the logic chip 44 from becoming complicated.

The refresh test unit 50 has a counter 50a, a timer 50b, and a judgement part 50c. The counter 50a counts a refresh command REFCMD output from the command conversion unit 48, and outputs the count CNT to the judgement part 50c. The refresh command REFCMD is generated in accordance with command signals that the control signal generating unit 14a outputs in refreshing the memory cells of the memory chip not shown. The counter 50a is reset in response to the activation of a timing signal TIM from the timer 50b.

The timer 50b includes a ring oscillator or the like. It activates the timing signal TIM at the same intervals as the refresh intervals necessary to retain data in the memory cells of the DRAM (memory chip). The judgement part 50c activates a defect detection signal FAIL when the count CNT falls out of a predetermined range upon the activation of the timing signal TIM. That is, the refresh test unit 50 activates the defect detection signal FAIL when the interface unit 14 has not generated a predetermined number of refresh commands within a predetermined period.

The data input/output unit 52 inputs and outputs read/write data, and outputs a predetermined pattern of data to the interface unit 14 in response to the activation of the defect detection signal FAIL.

This embodiment can offer the same effects as those obtained from the first embodiment described above. Moreover, in this embodiment, the formation of not a DRAM but an SRAM on the logic chip 44 can prevent the manufacturing process of the logic chip 44 from becoming complicated. Since the internal memory 46 is composed of easily manufacturable memory cells, the logic chip 44 can be reduced in chip size. This avoids an increase in the manufacturing cost of the logic chip 44.

Since the internal memory 46 is provided with the command conversion unit 48 which converts DRAM commands into SRAM-operating control signals, the internal memory 46 can be operated as if it is a DRAM. As a result, the internal memory 46 can substitute the memory chip to perform tests on the interface unit 14 and the like.

The formation of the refresh test unit 50 on the internal memory 46 allows a judgement whether the refresh command REFCMD is generated properly or not, even when the internal memory 46 has no memory elements in DRAMs. That is, the functional tests of the control circuit for generating the refresh command REFCMD and the interface unit 14 on the logic chip 44 can be performed by the logic chip 44 alone.

Since the refresh test unit 50 is provided with the counter 50a for counting the refresh command REFCMD and the timer 50b for setting the counting period of the counter 50a, the functional test as to the refresh operation can be performed easily.

Figure 9:
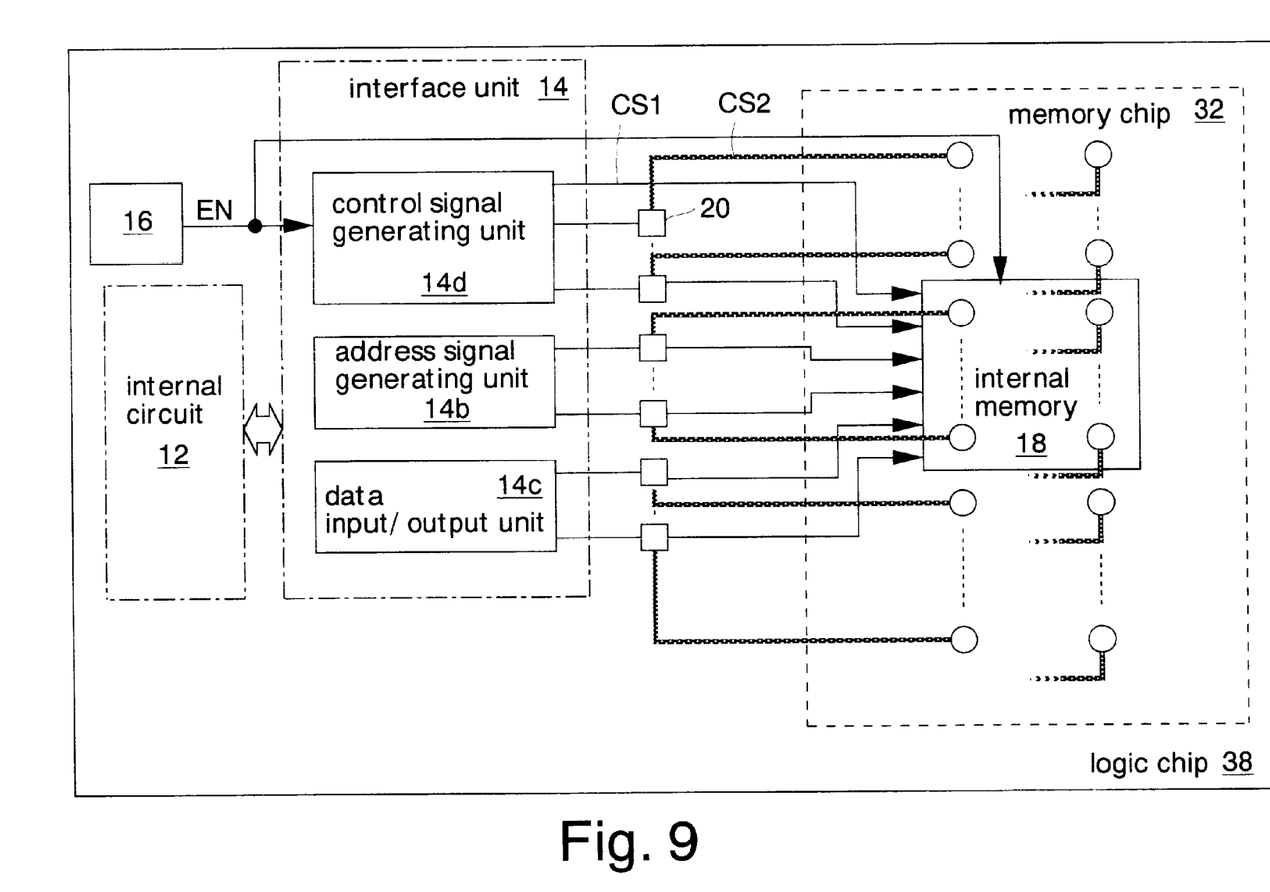
FIG. 9 is a block diagram showing a multichip module of a sixth embodiment.

FIG. 9 shows the essential parts of a sixth embodiment of the semiconductor device and multichip module in the present invention. The same elements as those described in the third embodiment will be designated by identical reference numbers. Detailed description thereof will be omitted.

In this embodiment, the enable signal EN output from the memory selecting circuit 16 is supplied to not only the control signal generating unit 14d but also the internal memory 18. Other configurations of this embodiment are identical to that of the third embodiment.

The internal memory 18, when the enable signal EN is inactivated, shuts off the power supply from exterior to enter a power-down state. Here, the power consumption of the internal memory 18 falls to approximately zero. The internal memory 18 enters the power-down state when the memory chip 32 is in operation.

This embodiment can offer the same effects as those obtained from the third embodiment described above. Besides, in this embodiment, the power consumption of the internal memory 18 falls to approximately zero when the memory chip 32 is in operation. This allows a reduction in the power consumption of the MCM here.

The first embodiment described above has dealt with the case where the enable signal EN is activated in accordance with the voltage applied to the pad 24. However, the present invention is not limited to such an embodiment. For example, a fuse connected to a power supply line may be formed in place of the pad 24 so that the enable signal EN is activated before a blow of the fuse and is inactivated after the blow of the fuse.

The second embodiment described above has dealt with the case where the internal memory 18 or the memory chip 36 is activated in accordance with the voltage applied to the pad 24. However, the present invention is not limited to such an embodiment. For example, a register for activating the enable signal EN may be formed on the logic chip 34 so that the enable signal EN is activated by modifying the value of the register depending on command inputs and the like from exterior.

The second embodiment described above has dealt with the case where the internal memory 18 is used as a memory intended for the probe test on the logic chip 34. However, the present invention is not limited to such an embodiment. For example, like the memory chip 36, the internal memory 18 may also be used as a buffer memory or the like. This allows an increase in the memory capacity available to the MCM. Alternatively, the internal memory 18 may be used as the buffer memory for situations where the logic chip 34 constitutes a system alone by itself, with the memory chip 36 as an extended memory.

The third embodiment described above has dealt with the case where the chip select signals CS1 and CS2 for starting a read operation or write operation of the internal memory 18 and the memory chip 32 are controlled. However, the present invention is not limited to such an embodiment. For example, chip activating signals for bringing the internal memory and the memory chip into a readable or writable state may be controlled. In the cases of using a clock synchronous memory, a clock enable signal for controlling the supply of a clock signal to the memory interior may be controlled. The clock enable signal can be inactivated for a significant reduction in the power consumption of the memory.

The fourth embodiment described above has dealt with the case where the first interface unit 42a for controlling the internal memory 18 and the second interface unit 42b for controlling the memory chip 32 are formed. However, the present invention is not limited to such an embodiment. For example, the first and second interface units 42a and 42b may be formed in association with the data input/output units 14c alone. Since the signal lines of the data input/output units 14c, of which high speed operations are required, are separated for reduced parasitic capacitances, the interface unit 42 can be minimized in circuit scale to operate the internal memory 18 and the memory chip 32 at high speed.

The fifth embodiment described above has dealt with the case where the refresh test unit 50 is formed inside the internal memory 46. However, the present invention is not limited to such an embodiment. For example, the refresh test unit 50 may be formed on the logic chip 44, independent of the internal memory 46.

The fifth embodiment described above has dealt with the case where the timer 50b consists of a ring oscillator. However, the present invention is not limited to such an embodiment. For example, the timer may be composed of a counter for counting a clock supplied from exterior.

The invention is not limited to the above embodiments and various modifications may be made without departing from the spirit and scope of the invention. Any improvement may be made in part or all of the components.

What is claimed is:

1. A semiconductor device comprising:
   an interface unit for connecting with an external semiconductor memory chip via signal terminals;
   an internal memory coupled to at least a part of said interface unit; and
   a memory control circuit for making said internal memory accessible to the interface unit instead of having the interface unit access said external semiconductor memory chip in a test operation mode, and for making said internal memory inaccessible to the interface unit in another operation mode other than said test operation mode.

2. The semiconductor device according to claim 1, wherein
   at least a part of said interface unit is shared between said internal memory and said external semiconductor memory chip.

3. The semiconductor device according to claim 1, wherein said interface unit includes:
   a first interface unit for outputting a control signal in said test operation mode, connected to said internal memory; and
   a second interface unit for outputting a control signal in said another operation mode, connected to said external semiconductor memory chip.

4. The semiconductor device according to claim 3, wherein:

said first interface unit outputs a first selecting signal activated upon access to said internal memory;

said second interface unit outputs a second selecting signal activated upon access to said external semiconductor memory chip; and said memory control circuit activates said first interface unit in said test operation mode to operate said internal memory, and activates said second interface unit in said another operation mode to operate said external semiconductor memory chip.

5. The semiconductor device according to claim 3, wherein said first interface unit outputs a first activating signal activated in making said internal memory accessible;

said second interface unit outputs a second activating signal activated in making said external semiconductor memory chip accessible; and said memory control circuit activates said first interface unit in said test operation mode to enable said internal memory to operate, and activates said second interface unit in said another operation mode to enable said external semiconductor memory chip to operate.

6. The semiconductor device according to claim 1, comprising an external terminal for transmitting information which indicates said test operation mode or in said another operation mode to said external semiconductor memory chip.

7. The semiconductor device according to claim 1, wherein said another operation mode is a normal operation mode for operating said external semiconductor memory chip.

8. The semiconductor device according to claim 1, wherein a memory capacity of said internal memory is smaller than that of said external semiconductor memory chip.

9. The semiconductor device according to claim 1, wherein:

memory elements of said internal memory are different in type from those of said external semiconductor memory chip; and said internal memory has a conversion circuit for converting a timing for outputting a control signal for said external semiconductor memory chip from said interface unit into a timing for operating said internal memory.

10. The semiconductor device according to claim 9, wherein said conversion circuit converts said timing for outputting the control signal so that said internal memory imitatively operates the same as that of said external semiconductor memory chip.

11. The semiconductor device according to claim 9, wherein:

said external semiconductor memory chip has dynamic memory elements which requires rewriting data for retaining said data; and said internal memory has static memory elements which requires no rewriting of data for retaining said data.

12. The semiconductor device according to claim 11, wherein:

said interface unit transmits a refresh controlling signal for rewriting said data to said external semiconductor memory chip and said internal memory; and said internal memory includes a functional test unit for judging whether said refresh controlling signal transmitted properly or not.

13. The semiconductor device according to claim 12, wherein said functional test unit counts the number of times said refresh controlling signal is activated during a predetermined period, and outputs a result of the judgement in accordance with the count.

14. A multichip module including a semiconductor device and a semiconductor memory chip, said semiconductor device comprising:

an interface unit for connecting with an external semiconductor memory chip via signal terminals;

an internal memory coupled to at least a part of said interface unit; and a memory control circuit for making said internal memory accessible to the interface unit instead of having the interface unit access said semiconductor memory chip in a test operation mode, and for making said internal memory inaccessible to the interface unit in another operation mode other than said test operation mode.

15. The multichip module according to claim 14, wherein at least a part of said interface unit is shared between said internal memory and said external semiconductor memory chip.

16. The multichip module according to claim 14, wherein said interface unit includes:

a first interface unit for outputting a control signal in said test operation mode, connected to said internal memory; and a second interface unit for outputting a control signal in said another operation mode, connected to said external semiconductor memory chip.

17. The multichip module according to claim 14, wherein said another operation mode is a normal operation mode for operating said external semiconductor memory chip.

* * * * *